United States Patent
Jayachandran et al.

(10) Patent No.: US 9,818,458 B1
(45) Date of Patent: Nov. 14, 2017

(54) TECHNIQUES FOR ENTRY TO A LOWER POWER STATE FOR A MEMORY DEVICE

(71) Applicant: Intel Corporation, Santa Clara, CA (US)

(72) Inventors: Sowmiya Jayachandran, Portland, OR (US); Rajesh Sundaram, Folsom, CA (US); Robert Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/862,269

(22) Filed: Sep. 23, 2015

(51) Int. Cl.
*G11C 5/14* (2006.01)
*G11C 7/00* (2006.01)

(52) U.S. Cl.
CPC .............. *G11C 5/147* (2013.01); *G11C 5/148* (2013.01); *G11C 7/00* (2013.01)

(58) Field of Classification Search
CPC ............ G11C 5/147; G11C 7/00; G11C 5/148
See application file for complete search history.

(56) References Cited

U.S. PATENT DOCUMENTS

| | | | | |
|---|---|---|---|---|
| 5,774,863 A * | 6/1998 | Okano | .................... | G11C 7/16 704/270 |
| 2001/0043493 A1 * | 11/2001 | Fujioka | ................ | G06F 1/3203 365/189.09 |
| 2002/0013881 A1 | 1/2002 | Delp et al. | | |
| 2004/0000946 A1 | 1/2004 | Mitsui | | |
| 2006/0294403 A1 * | 12/2006 | Bennett | ................. | G06F 1/3203 713/300 |
| 2009/0016137 A1 * | 1/2009 | Hur | ..................... | G06F 13/1626 365/226 |
| 2009/0091996 A1 | 4/2009 | Chen et al. | | |
| 2012/0159199 A1 | 6/2012 | Soman | | |
| 2013/0173858 A1 | 7/2013 | Brittain et al. | | |
| 2013/0188436 A1 | 7/2013 | Thyagarajan et al. | | |
| 2015/0338893 A1 * | 11/2015 | Park | ......................... | G06F 1/24 711/166 |
| 2016/0203075 A1 * | 7/2016 | Shin | .................... | G06F 12/0246 711/103 |

FOREIGN PATENT DOCUMENTS

WO 2015-069530 A2 5/2015

OTHER PUBLICATIONS

International Search Report and Written Opinion received for International Application No. PCT/US2016/042866, dated Nov. 10, 2016, 17 pages.

* cited by examiner

*Primary Examiner* — Khamdan Alrobaie
(74) *Attorney, Agent, or Firm* — Compass IP Law PC

(57) ABSTRACT

Examples are given for techniques for entry to a lower power state for a memory device or die. The examples to include delaying transitions of the memory device or die from a first higher consuming power state to a second relatively lower power state using one or more programmable counters maintained at or with the memory device.

27 Claims, 9 Drawing Sheets

700

RECEIVE, AT A MEMORY DEVICE, A COMMAND FROM A MEMORY DEVICE CONTROLLER FOR THE MEMORY DEVICE TO COMPLETE ONE OR MORE OPERATIONS
702

START A FIRST COUNTER HAVING A FIRST COUNT VALUE FOLLOWING COMPLETION OF THE ONE OR MORE OPERATIONS, THE FIRST COUNTER MAINTAINED AT THE MEMORY DEVICE
704

CAUSE THE MEMORY DEVICE TO TRANSITION FROM AN IDLE POWER STATE TO A FIRST LOW POWER STATE RESPONSIVE TO THE FIRST COUNTER EXPIRING, THE FIRST LOW POWER STATE TO RESULT IN THE MEMORY DEVICE CONSUMING LESS POWER COMPARED TO THE IDLE POWER STATE
706

START A SECOND COUNTER HAVING A SECOND COUNT VALUE FOLLOWING EXPIRATION OF THE FIRST COUNTER, THE SECOND COUNTER MAINTAINED AT THE MEMORY DEVICE
708

CAUSE THE MEMORY DEVICE TO TRANSITION FROM THE FIRST LOW POWER STATE TO A SECOND LOW POWER STATE RESPONSIVE TO THE SECOND COUNTER EXPIRING, THE SECOND LOW POWER STATE TO RESULT IN THE MEMORY DEVICE CONSUMING LESS POWER COMPARED TO THE FIRST LOW POWER STATE
710

*FIG. 7*

Storage Medium 800

Computer Executable Instructions for 700

*FIG. 8*

TECHNIQUES FOR ENTRY TO A LOWER POWER STATE FOR A MEMORY DEVICE

BACKGROUND

Memory devices or dies included in various type of storage or system memory devices are being deployed in increasingly higher densities. For example, a high storage capacity solid state drive (SSD) may include nearly 100 separate memory devices or dies. Each of the memory devices or dies can consume power.

BRIEF DESCRIPTION OF THE DRAWINGS

FIG. 7 illustrates an example second logic flow.
FIG. 8 illustrates an example storage medium.

DETAILED DESCRIPTION

Figure 1:
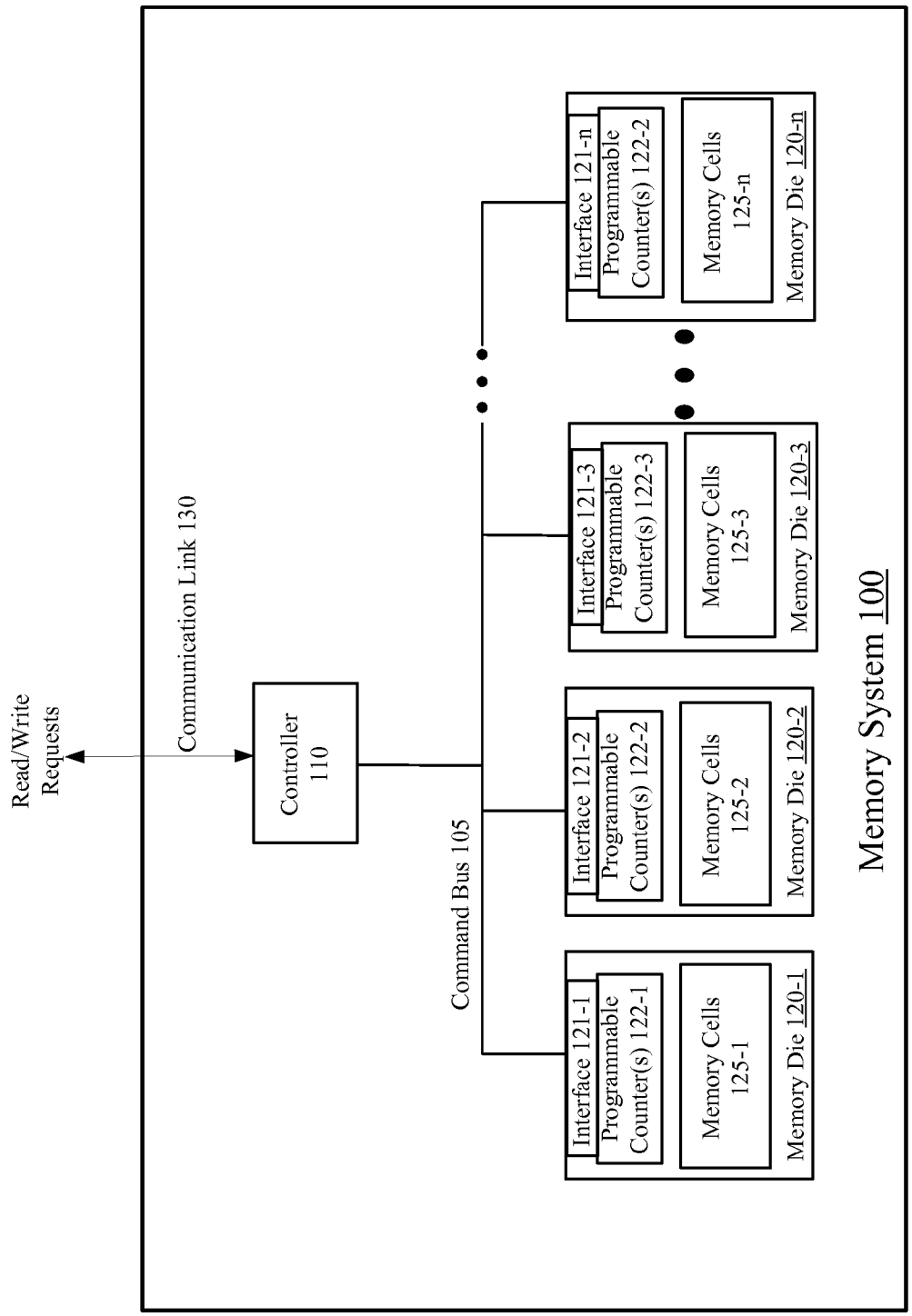
FIG. 1 illustrates an example memory system.

As contemplated in the present disclosure, high density SSDs may have memory dies including types of advanced non-volatile memory such as, but not limited to, 3-dimensional (3D) cross-point memory. In some configurations a significant percentage of active power may be consumed by inactive 3D cross-point memory dies that may be in an idle power state. Higher power draw often translates to lower performance due to a need for throttling for a given SSD to stay within an assigned power and/or heat envelope. For example, the given SSD may include 100 3D cross-point memory dies and during operation 90 of these dies may be in an idle power state. If each dies consumes 30 milliwatts (mW) while in the idle power state this would equate to 2.7 W of power consumption. However if the 90 dies were transitioned to a low power state that may consume merely 0.3 mW per die, that would equate to just 27 mW of power consumption—a 100× reduction in power consumed.

A currently known solution to having a large number of dies in a higher power consuming idle state is to employ individual die-level power management by a memory device controller. A controller issues a command to each die to enter or exit low power state. The individual die-level power management may be problematic as it adds complexity to the memory device controller as the memory device controller would need to manage and track a high number of die in a memory system or SSD. Further, the memory system or SSD may experience lower performance as bus bandwidth (e.g., command bus bandwidth) between the memory device controller and the memory dies would be consumed to implement this individual die-level power management scheme. Managing individual power states for the large number of dies may also take away memory device controller cycles from doing other performance critical activities such as, but not limited to, sequential or continuous write operations.

FIG. 1 illustrates an example memory system 100. As shown in FIG. 1, memory system 100 includes a controller 110 coupled with memory dies 120-1 to 120-n via command bus 105, where "n" represents any positive whole integer greater than 1. According to some examples, controller 110 may receive and/or fulfill read/write requests via communication link 130. Although not shown in FIG. 1, in some examples, communication link 130 may communicatively couple controller 110 to elements or features associated with a host computing device (e.g., an operating system and/or applications). For these examples, memory system 100 may be a memory device for the computing device. As a memory device, memory system 100 may serve as a two level memory (2LM) system or a solid state drive (SSD) for the computing device.

In some examples, as shown in FIG. 1, memory dies 120-1 to 120-n may separately include respective interfaces 121-1 to 121-n. Interfaces 121-1 to 121-n may be arranged such that controller 110 may be able to individually program respective programmable counter(s) 122-1 to 122-n at memory dies 120-1 to 120-n. As described in more details below, programmable counter(s) 122-1 to 122-n may separately include one or more first programmable counters to enable a first count value to be programmed to the one or more separately included first programmable counters. The first count value may set a first delay for respective memory cells 125-1 to 125-n to automatically transition from an idle power state to a first low power state after completion of one or more operations addressed to a given memory die from among memory dies 120-1 to 120-n responsive to a command received from controller 110 via command bus 105. The first low power state may cause respective memory cells 125-1 to 125-n to consume less power compared to the idle power state.

Also as described more below, programmable counter(s) 122-1 to 122-n may separately include one or more second programmable counters to enable a second count value to be separately programmed to these one or more second programmable counter(s) 122-1 to 122-n. The second count value may set a second delay for respective memory cells 125-1 to 125-n to automatically transition from the first low power state to a second low power state after expiration of the one or more first programmable counters. The second low power state may cause respective memory cells 125-1 to 125-n to consume less power compared to the idle power state.

According to some examples, memory cells 125-1 to 125-n of memory dies 120-1 to 120-n may include non-volatile and/or volatile types of memory. Non-volatile types of memory may include, but are not limited to, 3D cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or Spin Transfer Torque (STT)—megnetorestive random access memory (MRAM). Volatile types of memory may include, but are not limited to, dynamic random access memory (DRAM) or static RAM (SRAM).

In some examples, memory system 100 may serve as main memory for a host computing device (not shown). For these examples, memory system 100 may include two levels of memory including cached subsets of system disk level storage. In this configuration, the main memory may include "near memory" arranged to include volatile types of memory and "far memory" arranged to include volatile or non-volatile types of memory. The far memory may include volatile or non-volatile memory that may be of a higher capacity and possibly slower access times compared to the volatile memory included in the near memory. The far memory may be presented as "main memory" to an operating system (OS) for the host computing device while the near memory is a cache for the far memory that is transparent to the OS. The management of memory system 100 may be done by a combination of logic and modules executed via either controller 110 and/or processing circuitry (e.g., a CPU) for the host computing device. Near memory may be coupled to the processing circuitry via high bandwidth, low latency means for efficient processing. Far memory may be coupled to the processing circuitry via relatively lower bandwidth and high latency means.

According to some examples, communications to or from controller 110 via communication link 130 may be routed through a Serial Advanced Technology Attachment (SATA) interface to service read/write requests. In another example, communications to or from controller 110 via communication link 130 may be routed through a Serial Attached Small Computer System Interface (SCSI) (or simply SAS) interface. In another example, communications to or from controller 110 via communication link 130 may be routed through a Peripheral Component Interconnect Express (PCIe) interface. In another example, communications to or from controller 110 via communication link 130 may be routed through a Non-Volatile Memory (NVM) Express interface.

Figure 2:
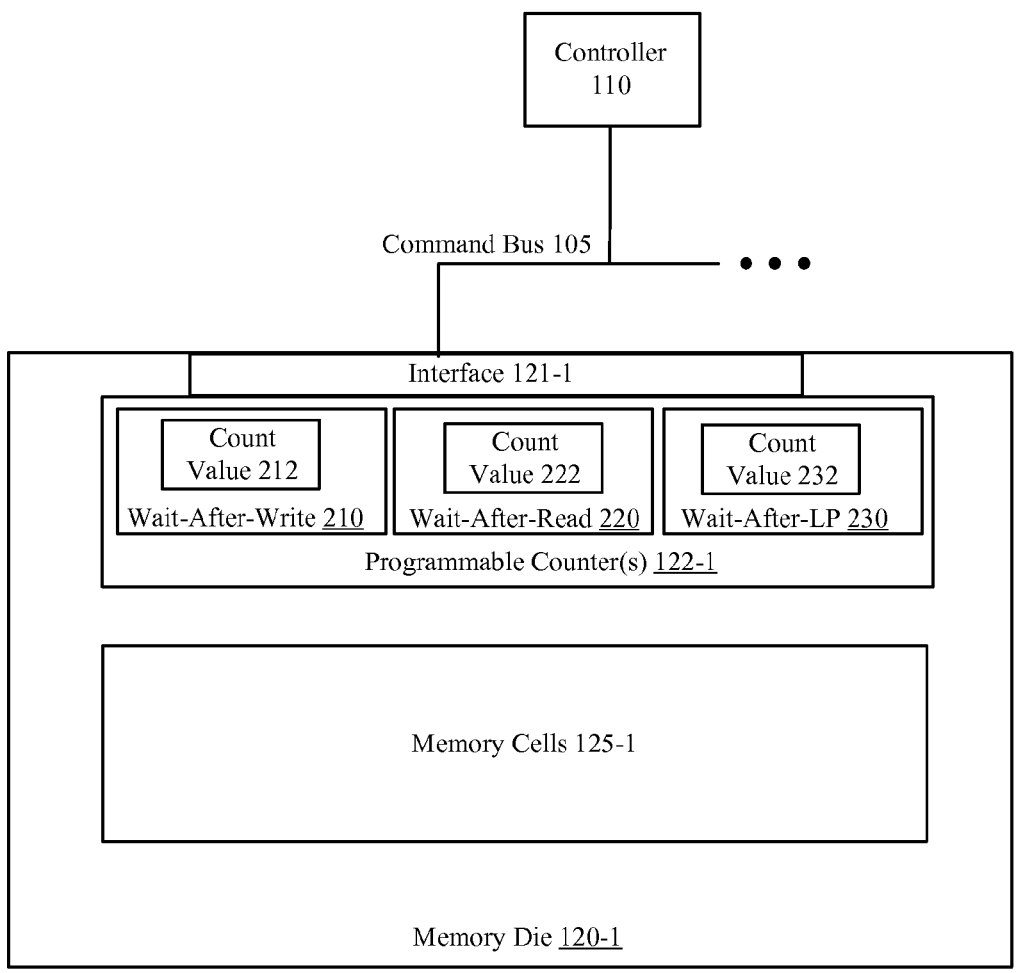
FIG. 2 illustrates an example portion of the memory system.

FIG. 2 illustrates an example portion 200 of memory system 100. As shown in FIG. 2, portion 200 of system 100 includes controller 100 coupled to memory die 120-1 via command bus 105. Also, in some examples, as shown in FIG. 2, programmable counters 122-1 may include a wait-after-write counter 210, a wait-after-read counter 220 and a wait-after-LP counter 230.

According to some examples, wait-after-write counter 210 and wait-after-read counter 220 may be part of first programmable counters to be programmed with respective count values 212 and 222 by controller 110 through interface 121-1. For these examples, count value 212 or 222 may set a first delay for memory cells 125-1 to transition from an idle power state to a first low power state after completion of one or more operations. The memory cells may complete the one or more operations responsive to a command from controller 110 that may have been received over command bus 105. For example, the command may be a write command and count value 212 may set a first delay after a write operation is completed by the plurality of memory cells responsive to the write command. In another example, the command may be a read command and count value 222 may set a first delay after a read operation is completed by the plurality of memory cells responsive to the read command. Also, for these examples, the first low power state may cause memory cells 125 to consume less power compared to the idle power state.

In some examples, wait-after-LP counter 230 may be part of one or more second programmable counters to be programmed with count value 232 by controller 110 through interface 121-1. For these examples, count value 232 may set a second delay for memory cells 125-1 to automatically transition from the first low power state to a second low power state after expiration of either wait-after-write counter 210 or wait-after-read counter 220 (e.g., depending on what command was last received from controller). Counting down from or up to count value 232 may commence immediately after expiration of either wait-after-write counter 210 or wait-after-read counter 220 so that there is a continuous count down or count up. The second power state may cause memory cells 125-1 to consume less power compared to the first low power state. The comparison of less power may include, but is not limited to the second lower power state to cause memory cells 125-1 to consume ½, ¼ or 1/10 of the amount of power compared to the first lower power state.

According to some examples, interface 121-1 to wait-after-write counter 210, wait-after-read counter 220 or wait-after-LP counter 230 may include a communication interface to a plurality of registers (not shown) maintained with memory cells 125-1 on memory die 120-1. The plurality of registers may be accessible through interface 121-1 to controller 110 via command bus 105 or via a separate control/programming bus (not shown) between controller 110 and memory die 120-1. For these examples, count values 212, 222 or 232 may be programmed to respective wait-after-write counter 210, wait-after-read counter 220 or wait-after-LP counter 230 based on controller 110 being able to store information for these count values to at least some of the plurality of registers through interface 121-1.

In some examples, counts up or down associated with the various programmable counter(s) 122-1 may be associated with a clock signal (CLK) received through interface 121-1 (e.g., via command bus 105).

Figure 3:
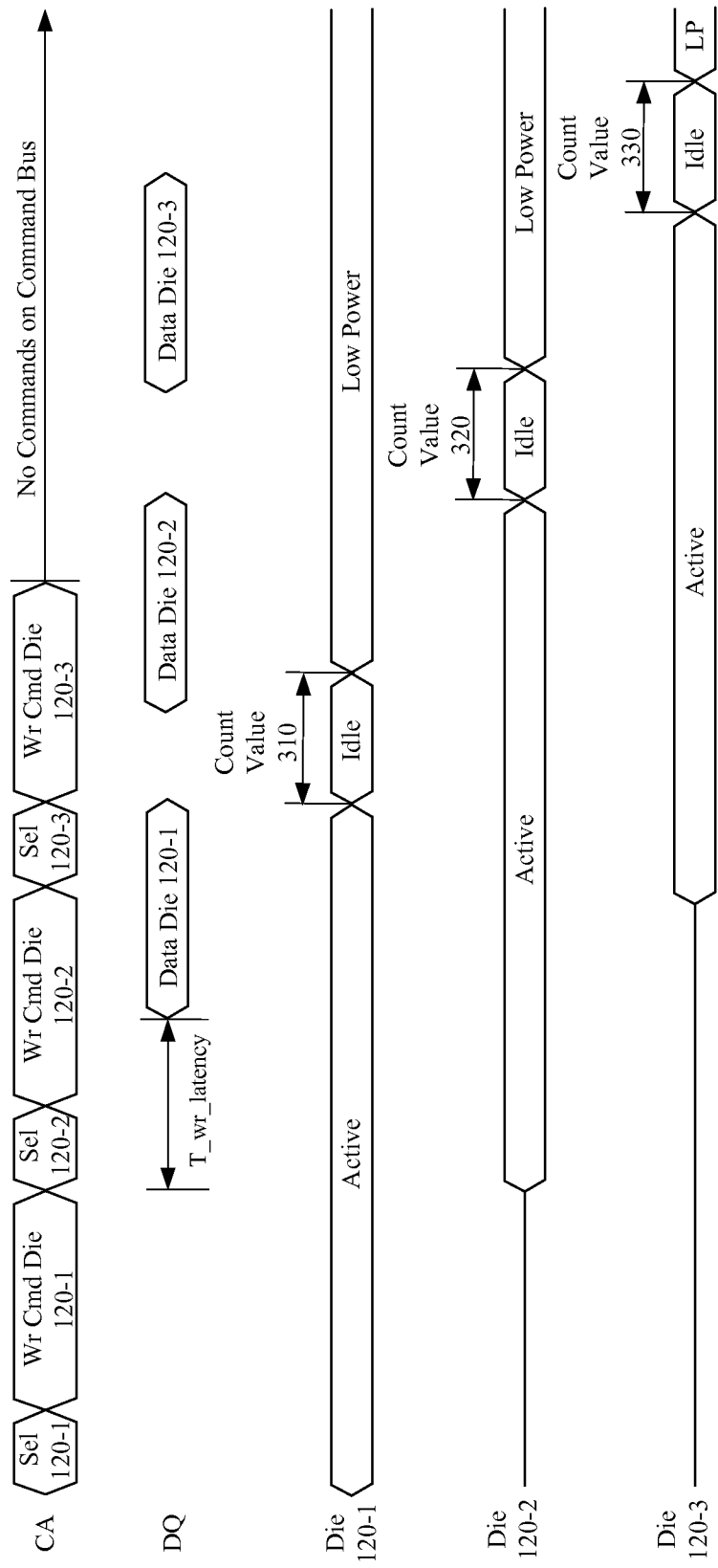
FIG. 3 illustrates an example first timing diagram.

FIG. 3 illustrates an example timing diagram 300. In some examples, as shown in FIG. 3, timing diagram 300 includes command and address (CA) and data (DQ) buses/lines for some of the memory dies included in system 100 that are shown as dies 120-1, 120-2 and 120-3. The CA bus/line, for example, may be similar to command bus 105 shown in FIGS. 1 and 2. According to some examples, die 120-1 may first be selected by controller 110 to receive a write command as shown in FIG. 3. This selection of die 120-1 causes memory cells 125-1 of die 120-1 to be in an active power state. As shown in FIG. 3, a latency between controller 110 putting the write command on the CA bus/line for die 120-1 and data to be written to die 120-1 being received from the DQ bus/line is shown as T_wr_latency. Following completion of the write operation by memory cells 125-1, die 120-1 transitions to an idle power state. Count value 310 indicates a delay for memory cells 125-1 to transition from the idle power state to a low power state. Count value 310 may have been programmed to a first set of programmable counters maintained at die 120-1 that includes wait-on-write counter 210. Thus count value 310 may be similar to count value 222 mentioned above for FIG. 2. The low power state may cause memory cells 125-1 to consume less power than when in the idle power state. Die 120-1 may remain in the low power state for either programmed amount of time (e.g., based on a second count value) or may transition back to an active power state if selected to receive another command (e.g., a write or read command).

In some examples, as shown in FIG. 3, Dies 120-2 and 120-3 may go through a similar timing sequence as die 120-1. Respective count values 320 and 330 for dies 120-2 and 120-3 may be the same or different than count value 310 for die 120-1. Controller 110 may program different count values according to usage schemes that cause some dies to be kept in idle states for longer or shorter times compared to other dies. These usage schemes may attempt to balance power saving with performance.

According to some examples, alternatively to what is shown in FIG. 3 for dies 120-1 to 120-3, a given die may receive a second command from controller 110 before its wait-on-write counter value has expired. For these examples, the given die's wait-on-write counter may be stopped responsive to this second command and the memory cells for the given memory die may transition from the idle power state to an active power state. The active power state may cause the memory cells for the given memory die to consume more power compared to the idle power state. For example, if die 120-2 received a second command before count value 320 reaches zero or die 120-2's wait-on-write counter expires, the wait-on-write counter is stopped and the memory cells 125-2 may be transitioned to an active power state.

Figure 4:
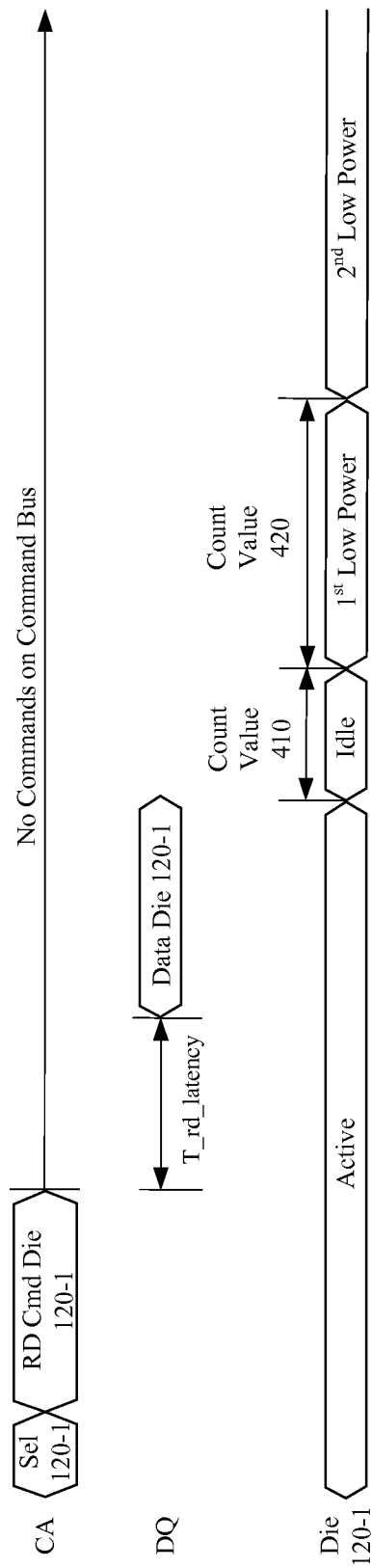
FIG. 4 illustrates an example second timing diagram.

FIG. 4 illustrates an example time diagram 400. In some examples, as shown in FIG. 4, timing diagram 400 may include an example of a timing diagram for a read command received by die 120-1. Although this disclosure is not limited to just die 120-1 implementing timing diagram 400, any number of memory dies of memory system 100 may implement timing diagram 400 or a timing diagram similar to timing diagram 400. For these examples, controller 110 may send the read command on a CA bus/line (e.g., command bus 105). A latency between controller 110 putting the read command on the CA bus/line and data to be read from die 120-1 being placed on a DQ bus/line is shown in FIG. 4 as T_rd_latency. Following completion of the read operation by memory cells 125-1, die 120-1 transitions to an idle power state. Count value 410 indicates a first delay for memory cells 125-1 to transition from the idle power state to a first low power state. Count value 410 may have been programmed to a first set of programmable counters maintained at die 120-1 that includes wait-on-read counter 220. Thus count value 410 may be similar to count value 222 mentioned above for FIG. 2.

According to some examples, count value 420 may indicate a second delay for memory cells 125-1 to transition from the first low power state to a second low power state. For these examples, count value 420 may have been programmed to a second set of programmable counters maintained at die 120-1 that includes wait-on-LP counter 230. Thus count value 420 may be similar to count value 232 mentioned above for FIG. 2. The second low power state may cause memory cells 125-1 to consume less power than when in the first low power state. Examples are not limited to first and second low power states. Additional lower power state transitions are contemplated that may include additional programmable counters each having their own respective programmable count values. The number of different lower power states as well as count values to be programmed for these power states may be usage model or scheme dependent based on, for example, an attempt to balance power saving with performance.

In some examples, alternatively to what is shown in FIG. 4, die 120-1 die may receive a second command from controller 110 before either the wait-on-read counter value (count value 410) has expired or the wait-on-LP counter value (count value 420) has expired. For these examples, die 120-1's wait-on-read or wait-on-LP counter may be stopped responsive to this second command and the memory cells for the given memory die may transition from the idle/low power state to an active power state. The active power state may cause the memory cells for the given memory die to consume more power compared to the idle power state.

Figure 5:
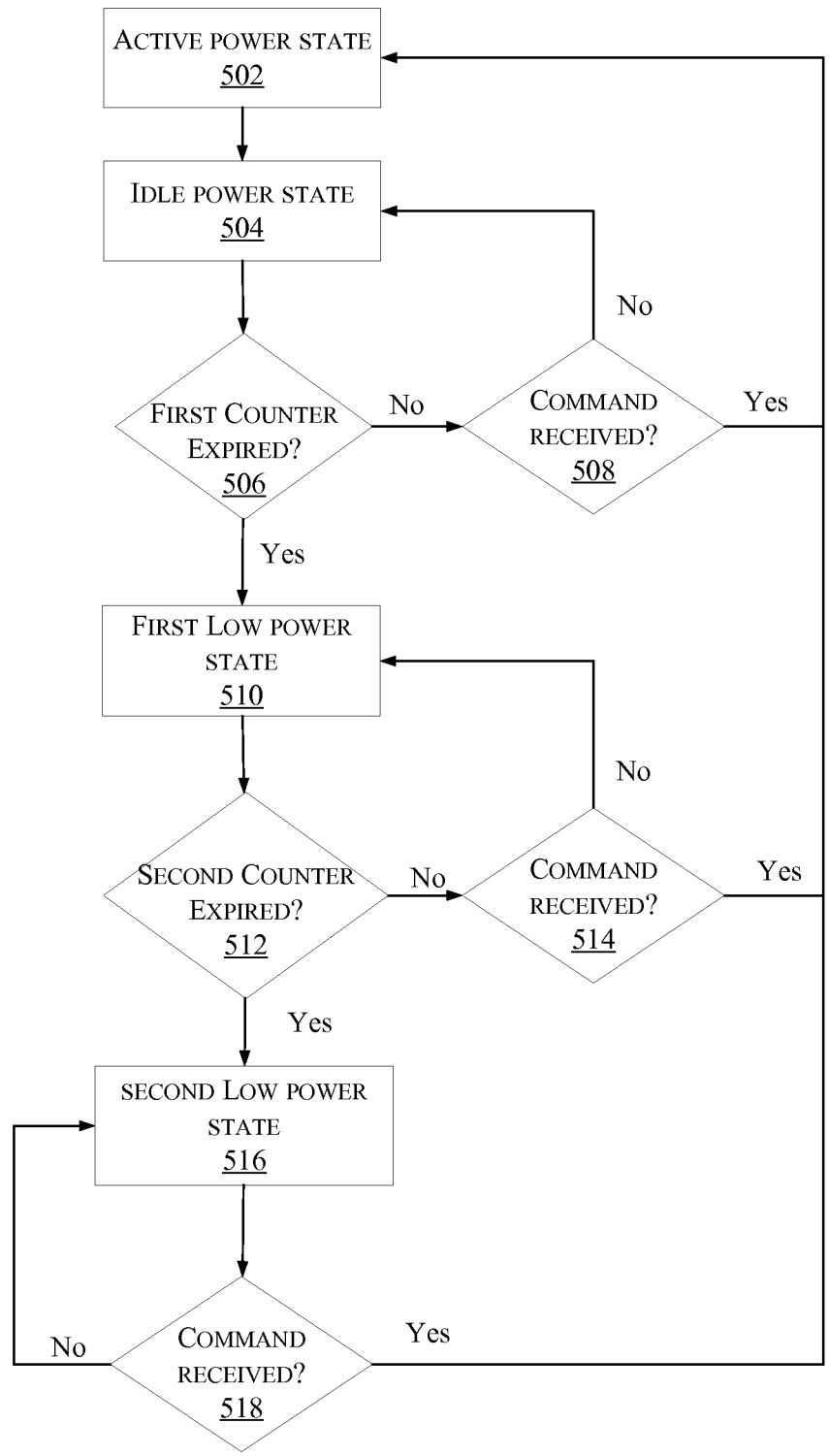
FIG. 5 illustrates an example first logic flow.

FIG. 5 illustrates a logic flow 500. In some examples, logic flow 500 may be implemented by logic and/or features at a memory die such memory die 120-1 shown and described above for FIGS. 1-4. However, logic flow 500 is not limited to implementations by logic and/or features at a memory die such as memory die 120-1 shown and described above for FIGS. 1-4.

At block 502, a memory die or device including a plurality of memory cells may be in an active power state following receipt of a command received from a memory device controller that may be received via a command/CA bus. The memory cells may remain in the active power state as one or more operations are completed responsive to the command (e.g., read or write operations).

At block 504, the memory cells of the memory die or device may transition to an idle power state. The idle power state may cause the memory cells to consume less power than when in the active power state. A first counter having a first count value may be started. This first counter may be maintained with the memory die or device and may be programmable in order to set a value for the first count value to delay a power state transition.

At decision block 506, if the first counter has expired, logic flow 500 moves to block 510. Otherwise, logic flow 500 moves to decision block 508.

At decision block 508, if a command is received by the memory die or device then logic flow moves to block 502 and transitions back to the active power state. Otherwise, logic flow 500 moves to block 504 and the memory die or device remains in the idle power state while the first counter continues to count either down or up based on the first count value.

At block 510, the first counter has expired. Responsive to the first counter expiring the memory die or device may transition to a first low power state. While in this first low power state, memory cells of the memory die or device may consume less power compared to the idle power state. A second counter having a second count value may be started. This second counter may also be maintained with the memory die or device and may be programmable in order to set a value for the second count value to delay a power state transition.

At decision block 512, if the second counter has expired, logic flow 500 moves to block 516. Otherwise, logic flow 500 moves to decision block 514.

At decision block 514, if a command is received by the memory die or device then logic flow moves to block 502 and transitions back to the active power state. Otherwise, logic flow 500 moves to block 510 and the memory die or device remains in the first low power state while the second counter continues to count either down or up based on the second count value.

At block 516, the second counter has expired. Responsive to the second counter expiring the memory or device may transition to a second low power state. While in this second low power state, memory cells of the memory die or device may consume less power compared to the first low power state.

At decision block 518, if a command is received by the memory die or device then logic flow moves to block 502 and transitions back to the active power state. Otherwise, the memory die moves to block 516 and remains in the second low power state.

Figure 6:
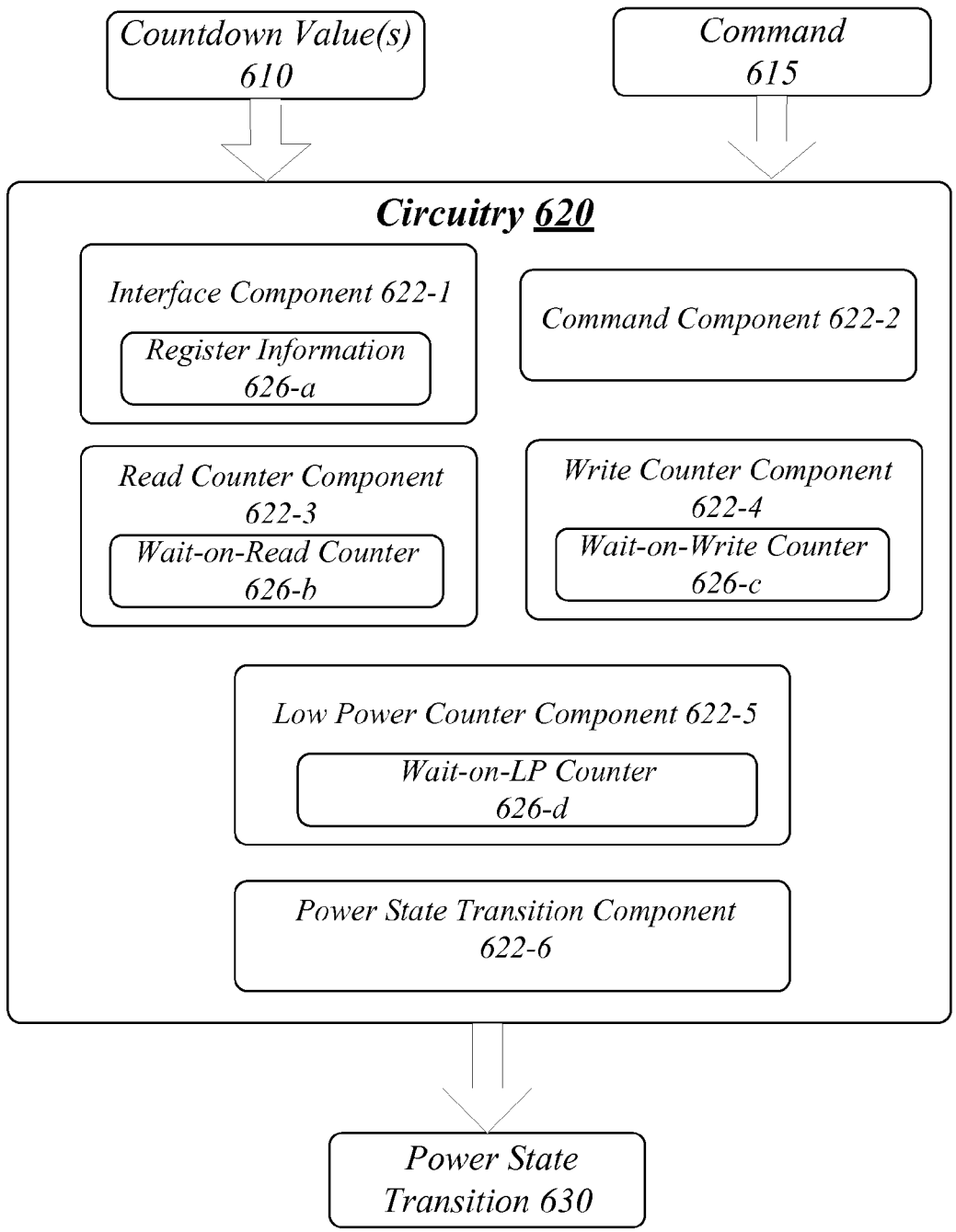
FIG. 6 illustrates an example apparatus.

FIG. 6 illustrates an example apparatus 600. Although the apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 620 that may execute at least some of the logic and/or features mentioned above for a memory device for at least FIGS. 1-5. Circuitry 620 may be arranged to execute one or more software or firmware implemented components 622-$a$. It is worthy to note that "a" and "b" and "c" and similar designators as used herein are intended to be variables representing any positive integer. Thus, for example, if an implementation sets a value for a=6, then a complete set of software or firmware components 622-a may include modules 622-1, 622-2, 622-3, 622-4, 622-5 or 622-6. The examples presented are not limited in this context and the different variables used throughout may represent the same or different integer values.

According to some examples, apparatus 600 may be capable of being located with a memory die or device included a memory system, e.g., as part of a memory system such as memory system 100. For these examples, apparatus 600 may be included in or implemented by circuitry 620 to include a processor, processor circuitry, microcontroller circuitry, an application-specific integrated circuit (ASIC) or a field programmable gate array (FPGA). In other examples, apparatus 600 may be implemented by circuitry 620 as part of firmware stored at or with a memory die or device. The examples are not limited in this context. In some examples, if implemented in a processor, the processor may be generally arranged to execute one or more components 622-a.

According to some examples, apparatus 600 may include an interface component 622-1. Interface component 622-1 may be executed by circuitry 620 to enable count values to be programmed to programmable counters maintained with the memory device or die that includes apparatus 600. For these examples, the count values may be included in count value(s) 610 and may be programmable through interface component 622-1 from a memory device controller that may be able to program the count values to a plurality of registers maintained at the memory device or die (e.g., via a command or control bus). Information related to the plurality of registers may be maintained with register information 626-a (e.g., in a lookup table (LUT)). Register information 626-a may include protocol information to use to interpret values set in these registers to determine programmed count values.

In some examples, apparatus 600 may also include a command component 622-2.

Command component 622-2 may be executed by circuitry 620 to receive commands from a memory device controller received via a command bus. For these examples, the commands may include write or read commands included in command 615 and may cause data to be written to or read from memory cells maintained at the memory die or device that includes apparatus 600.

According to some examples, apparatus 600 may also include a read counter component 622-3. Read counter component 622-3 may be executed by circuitry 620 to start a wait-on-read counter following completion of a read command by the memory cells maintained at the memory die or device. For these examples, the wait-on-read counter may be maintained with wait-on-read counter 626-b.

In some examples, apparatus 600 may also include a write counter component 622-4. Write counter component 622-4 may be executed by circuitry 620 to start a wait-on-write counter following completion of a write command by the memory cells maintained at the memory die or device. For these examples, the wait-on-write counter may be maintained with wait-on-write counter 626-c.

According some examples, apparatus 600 may also include a low power counter component 622-5. Low power counter component 622-5 may be executed by circuitry 620 to start a wait-on-LP counter following expiration of either the wait-on-write counter or the wait-on-read counter and transition of the memory device or die to at least a first low power state. For these examples, the wait-on-LP counter may be maintained with wait-on-LP counter 626-d.

In some examples, apparatus 600 may also include a power state transition component 622-5. Power state transition component 622-6 may be executed by circuitry 620 to cause the memory die or device to transition to various power states. For example, responsive to either the wait-on-write counter expiring, the wait-on-read counter expiring or the wait-on-LP counter expiring the power state transition component 622-6 may cause the plurality of memory cells of the memory die or device to transition to a different power state included in power state transition 630. Power state transition component 622-5 may also cause the memory die or device to transition out of an idle or low power state to an active power state responsive to receiving a second or additional command from the memory device controller.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 7 illustrates a logic flow 700. Logic flow 700 may be representative of some or all of the operations executed by one or more logic, features, or devices described herein, such as apparatus 600. More particularly, logic flow 700 may be implemented by interface component 622-1, command component 622-2, read counter component 622-3, write counter component 622-4, low power counter component 622-5 or power state transition component 622-6.

According to some examples, logic flow 700 at block 702 may receive, at a memory device, a command from a memory device controller for the memory device to complete one or more operations. For these examples, command component 622-2 may receive the command.

In some examples, logic flow 700 at block 704 may start a first counter having a first count value following completion of the one or more operations, the first counter maintained at the memory device. For these examples, if the command was a read command then read counter component 622-3 may start the first counter. If the command was a write command then write counter component 622-3 may start the first counter.

According to some examples, logic flow 700 at block 706 may cause the memory device to transition from an idle power state to a first low power state responsive to the first counter expiring, the first low power state to result in the memory device consuming less power compared to the idle power state. For these examples, power state transition component 622-6 may cause the transition to the first low power state.

In some examples, logic flow 700 at block 708 may start a second counter having a second count value following expiration of the first counter. For these examples, low power counter component 622-5 may start the second counter.

According to some examples, logic flow 700 at block 710 may cause the memory device to transition from the first low power state to a second low power state responsive to the second counter expiring, the second low power state to result in the memory device consuming less power compared to the first low power state. For these examples, power state transition component 622-6 may cause the memory device to transition from the first low power state to the second low power state.

FIG. 8 illustrates an embodiment of a storage medium 800. The storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
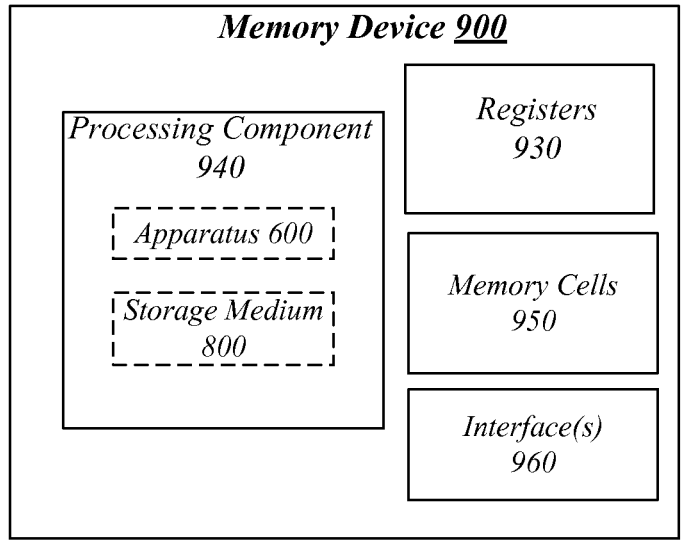
FIG. 9 illustrates an example memory device.

FIG. 9 illustrates an example memory device 900. In some examples, as shown in FIG. 9, memory device 900 may include registers 930, a processing component 940, memory cells 950 or an interfaces 960. According to some examples, memory device 900 may be implemented on a memory die included in a memory system similar to memory system 100.

According to some examples, registers 930 may include programmable data structures that may be programmed (e.g., by a memory device controller) via one or more interfaces included in interfaces 960. Registers 930, for example, may be programmed with count values to be used with various counters to enable memory cells 950 to transition to various power states responsive to these counters expiring.

According to some examples, processing component 940 may execute the components for apparatus 600 shown in FIG. 6 and/or storage medium 800 shown in FIG. 8. Processing component 940 may include various hardware and/or firmware elements. Examples of hardware elements may include, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of firmware elements may include embedded applications, embedded software modules, routines, subroutines, functions, methods, procedures, interfaces, instruction sets, computing code, computer code, code segments, computer code segments, words, values, symbols, or any combination thereof.

In some examples, memory cells 950 may include non-volatile and/or volatile types of memory. Non-volatile types of memory may include, but are not limited to, 3D cross-point memory, flash memory, ferroelectric memory, SONOS memory, polymer memory such as ferroelectric polymer memory, nanowire, FeTRAM or FeRAM, ovonic memory, nanowire or EEPROM. Volatile types of memory may include, but are not limited to, DRAM or static RAM SRAM.

In some examples, interfaces 960 may include logic and/or features to support interfaces maintained with a memory device controller or other management/control device for a memory system that includes memory device 900. For these examples, communications interface 960 may include one or more communication interfaces that operate according to various communication protocols or standards to communicate over communication links, buses or lines coupled with memory device 900. Communications may occur via use of communication protocols or standards described in one or more industry standards (including progenies and variants) such as those associated with the System Management Bus (SMBus) specification, the PCI Express (PCIe) specification, the Non-Volatile Memory Express (NVMe) specification, the Serial Advanced Technology Attachment (SATA) specification, Serial Attached SCSI (SAS) or the Universal Serial Bus (USB) specification.

The components and features of memory device 900 may be implemented using any combination of discrete circuitry, application specific integrated circuits (ASICs), logic gates and/or single chip architectures. Further, the features of computing platform 900 may be implemented using microcontrollers, programmable logic arrays and/or microprocessors or any combination of the foregoing where suitably appropriate. It is noted that hardware and/or firmware elements may be collectively or individually referred to herein as "logic", "circuit" or "circuitry."

One or more aspects of at least one example may be implemented by representative instructions stored on at least one machine readable or computer readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

According to some examples, a machine readable or computer readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

FIG. 9 illustrates an example computing platform 900. In some examples, as shown in FIG. 9, computing platform 900 may include a memory system 930, a processing component 940, other platform components 950 or a communications interface 960. According to some examples, computing platform 900 may be implemented in a computing device.

According to some examples, memory system 930 may be similar to memory system 100. For these examples, logic and/or features (e.g., included in an ECC decoder/controller) resident at or located with memory system 930 may execute at least some processing operations or logic for apparatus 600. Also, memory system 930 may include volatile or non-volatile types of memory (not shown) that may store ECC encoded data written to or read from in a similar manner as described above for memory 120 included in memory system 100.

According to some examples, processing component 940 may also execute at least some processing operations or logic for apparatus 600 and/or storage medium 800. Processing component 940 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 950 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 950 or memory system 930 may include without limitation, various types of computer readable and machine readable storage media in the form of one or more higher speed memory units, such as read-only memory (ROM), RAM, DRAM, Double-Data-Rate DRAM (DDRAM), synchronous DRAM (SDRAM), SRAM, programmable ROM (PROM), erasable programmable ROM (EPROM), electrically erasable programmable ROM (EEPROM), flash memory, nanowires, ferroelectric transistor random access memory (FeTRAM or FeRAM), polymer memory such as ferroelectric polymer memory, ovonic memory, 3-dimensional cross-point memory or ferroelectric memory, silicon-oxide-nitride-oxide-silicon (SO-NOS) memory, nanowire, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 960 may include logic and/or features to support a communication interface. For these examples, communications interface 960 may include one or more communication interfaces that operate according to various communication protocols or standards to communicate over direct or network communication links. Direct communications may occur via use of communication protocols or standards described in one or more industry standards (including progenies and variants) such as those associated with the System Management Bus (SMBus) specification, the PCI Express (PCIe) specification, the Non-Volatile Memory Express (NVMe) specification, the Serial Advanced Technology Attachment (SATA) specification, Serial Attached SCSI (SAS) or the Universal Serial Bus (USB) specification. Network communications may occur via use of communication protocols or standards such those described in one or more Ethernet standards promulgated by the Institute of Electrical and Electronics Engineers (IEEE). For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 900 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 900 described herein, may be included or omitted in various embodiments of computing platform 900, as suitably desired.

The components and features of computing platform 900 may be implemented using any combination of discrete circuitry, application specific integrated circuits (ASICs), logic gates and/or single chip architectures. Further, the features of computing platform 900 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Figure 10:
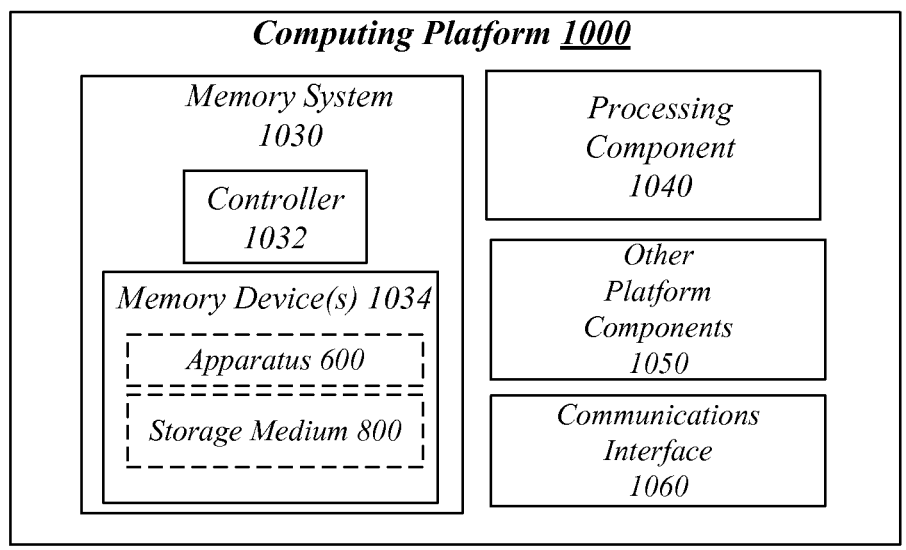
FIG. 10 illustrates an example computing platform.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may be similar to memory system 100 and includes a controller 1032 and memory devices(s) 1034. For these examples, logic and/or features resident at or located with memory device(s) 1034 may execute at least some processing operations or logic for apparatus 600 and may include storage media that includes storage medium 800. Also, memory device(s) 1034 may include similar types of volatile or non-volatile memory (not shown) that are described above for memory device 900 shown in FIG. 9.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, PLD, DSP, FPGA, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or memory system 1030 may include without limitation, various types of computer readable and machine readable storage media in the form of one or more higher speed memory units, such as ROM, RAM, DRAM, DDRAM, SDRAM, SRAM, PROM, EPROM, EEPROM, flash memory, nanowires, FeTRAM, FeRAM, polymer memory such as ferroelectric polymer memory, ovonic memory, 3-dimensional cross-point memory or ferroelectric memory, SONOS memory, nanowire, magnetic or optical cards, an array of devices such as RAID drives, solid state memory devices (e.g., USB memory), SSD and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

The follow examples pertain to additional examples of technologies disclosed herein.

Example 1

An example apparatus may include a plurality of memory cells arranged to complete one or more operations responsive to a command from a memory device controller received via a command bus. The apparatus may also include one or more first programmable counters maintained with the plurality of memory cells. The apparatus may also include an interface to the one or more first programmable counters to enable a first count value to be programmed to one or more of the first programmable counters, the first count value to set a first delay for the plurality of memory cells to transition from an idle power state to a first low power state after completion of the one or more operations, the first low power state to cause the plurality of memory cells to consume less power compared to the idle power state.

Example 2

The apparatus of example 1, the command may be one of a read command or a write command.

Example 3

The apparatus of example 2, when the command is the write command, the one or more first programmable counters may include a wait-after-write counter to count down or count up based on the first count value after a write operation is completed by the plurality of memory cells responsive to the write command.

Example 4

The apparatus of example 2, when the command is the read command, the one or more first programmable counters may include a wait-after-read counter to count down or count up based on the first count value after a read operation is completed by the plurality of memory cells responsive to the read command.

Example 5

The apparatus of example 1, the interface to the one or more programmable counters may include the interface serving as an interface to a plurality of registers maintained with the plurality of memory cells, the plurality of registers accessible to the memory device controller through the interface. For these examples, the first count value programmed to one or more of the first programmable counters may be based on the memory device controller able to store the first count value to at least some of the plurality of registers.

Example 6

The apparatus of example 1 may be a memory die arranged to be included with a plurality of other memory dies in a solid state drive. For these examples, the memory die and the plurality of other memory dies may receive commands from the memory device controller via the command bus.

Example 7

The apparatus of example 1, the one or more first programmable counters may be stopped responsive to a second command from the memory device controller received via the command bus before the first delay has expired. The plurality of memory cells may transition from the idle power state to an active power state after the one or more first programmable counters have been stopped. The active power state may cause the plurality of memory cells to consume more power compared to the idle power state.

Example 8

The apparatus of example 1 may also include one or more second programmable counters maintained with the plurality of memory cells. The apparatus may also include the interface to enable a second count value to be programmed to one or more of the second programmable counters. For these examples, the second count value may set a second delay for the plurality of memory cells to transition from the first low power state to a second low power state after expiration of the of the one or more first programmable counters. The second low power state may cause the plurality of memory cells to consume less power compared to the first low power state.

Example 9

The apparatus of example 8, the one or more second programmable counters may be stopped responsive to a second command from the memory device controller received via the command bus before the second delay has expired. The plurality of memory cells may transition from the second low power state to an active power state after the one or more second programmable counters have been stopped. The active power state may cause the plurality of memory cells to consume more power compared to the idle power state.

Example 10

The apparatus of example 1, the plurality of memory cells may include one or more types of memory to include 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire, electrically erasable programmable read-only memory (EEPROM) or dynamic random access memory (DRAM).

Example 11

An example method may include receiving, at a memory device, a command from a memory device controller for the memory device to complete one or more operations. The method may also include starting a first counter having a first count value following completion of the one or more operations, the first counter maintained at the memory device. The method may also include causing the memory device to transition from an idle power state to a first low power state responsive to the first counter expiring. the first low power state may result in the memory device consuming less power compared to the idle power state.

Example 12

The method of example 11 may also include receiving a second command from the memory device controller before the first counter has expired. The method may also include stopping the first counter based on receiving the second command. The method may also include causing the memory device to transition from the idle power state to an active power state, the active power state to result in the memory device consuming more power compared to the idle power state.

Example 13

The method of example 11 may also include programming the first counter to have the first count value responsive to receiving the first count value from the memory device controller.

Example 14

The method of example 13, receiving the first count value from the memory device through an interface accessible to the memory device controller. The interface to a plurality of registers maintained with the memory device. The plurality of registers accessible to the memory device controller through the interface.

Example 15

The method of example 11, the command may include a read command or a write command.

Example 16

The method of example 11, the memory device may include one of a plurality of memory dies included in a solid state drive. The plurality of memory dies may be capable of receiving commands from the memory device controller through at least one command bus.

Example 17

The method of example 11 may include starting a second counter having a second count value following expiration of the first counter, the second counter maintained at the memory device. The method may also include causing the memory device to transition from the first low power state to a second low power state responsive to the second counter expiring. The second low power state may result in the memory device consuming less power compared to the first low power state.

Example 18

The method of example 17 may also include receiving a second command from the memory device controller before the second counter has expired. The method may also include stopping the second counter based on receiving the second command. The method may also include causing the memory device to transition from the first low power state to an active power state. The active power state may result in the memory device consuming more power compared to the idle power state.

Example 19

The method of example 17 may also include programming the second counter to have the second count value responsive to receiving the second count value from the memory device controller.

Example 20

The method of example 19, receiving the second count value from the memory device through an interface accessible to the memory device controller. The interface to a plurality of registers maintained with the memory device. The plurality of registers accessible to the memory device controller through the interface.

Example 21

The method of example 11, the memory device comprising one or more types of memory to include one or more of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire, electrically erasable programmable read-only memory (EEPROM) or dynamic random access memory (DRAM).

Example 22

An example at least one machine readable medium including a plurality of instructions that in response to being executed by a system may cause the system to carry out a method according to any one of examples 11 to 21.

Example 23

An example apparatus may include means for performing the methods of any one of examples 11 to 21.

Example 24

An example system may include a memory controller. The system may also include a plurality of memory dies coupled with the memory controller via at least one command bus. For these examples, the plurality of memory dies may separately include a plurality of memory cells arranged to complete one or more operations responsive to a command from the memory device controller. The plurality of memory dies may also separately include one or more first programmable counters. The plurality of memory dies may also separately include an interface to the one or more first programmable counters to enable a first count value to be programmed to one or more of the first programmable counters. The first count value may set a first delay for the plurality of memory cells to transition from an idle power state to a first low power state after completion of the one or more operations. The first low power state may cause the plurality of memory cells to consume less power compared to the idle power state.

Example 25

The system of example 24, the command may be one of a read command or a write command.

Example 26

The system of example 25, when the command is the write command, the one or more first programmable counters may be a wait-after-write counter to count down or count up based on the first count value after a write operation is completed by the plurality of memory cells at a given memory die from among the plurality of memory dies responsive to the write command that is addressed to the given memory die.

Example 27

The system of example 25, when the command is the read command, the one or more first programmable counters comprises a wait-after-read counter to count down or count up based on the first count value after a read operation is completed by the plurality of memory cells at a given memory die from among the plurality of memory dies responsive to the read command that is addressed to the given memory die.

Example 28

The system of example 24, the interface to the one or more programmable counters may include the interface to a plurality of registers separately maintained by respective memory dies of the plurality of memory dies. The plurality of registers may be accessible to the memory device controller through the interface. The first count value programmed to one or more of the first programmable counters may be based on the memory device controller able to store the first count value to the plurality of registers.

Example 29

The system of example 24 may be a solid state drive.

Example 30

The system of example 24, the one or more first programmable counters may be stopped responsive to a second command from the memory device controller received via the command bus before the first delay has expired. For these examples, a given memory die that received the first and second commands to transition the given memory die's plurality of memory cells from the idle power state to an active power state after the one or more first programmable counters have been stopped. The active power state may cause the given memory die's plurality of memory cells to consume more power compared to the idle power state.

Example 31

The system of example 24, the plurality of memory dies to also separately include one or more second programmable counters and the interface to enable a second count value to be programmed to one or more of the second programmable counters. The second count value may set a second delay for the plurality of memory cells to transition from the first low power state to a second low power state after expiration of the one or more first programmable counters. The second low power state may cause the plurality of memory cells to consume less power compared to the first low power state.

Example 32

The system of example 31, the one or more second programmable counters may be stopped responsive to a second command from the memory device controller received via the command bus before the second delay has expired. For these examples, a given memory die that received the first and second commands to transition the given memory die's plurality of memory cells from the second low power state to an active power state after the one or more second programmable counters have been stopped. The active power state may cause the given memory die's plurality of memory cells to consume more power compared to the idle power state.

Example 33

The system of example 24, the plurality of memory cells may include one or more types of memory to include 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire, electrically erasable programmable read-only memory (EEPROM) or dynamic random access memory (DRAM).

34

The system of example 24 may also include a processor for a computing platform. The processor may be coupled with the memory controller. The system may also include a network interface for the computing platform. The network interface may be coupled with the processor and the memory controller.

Example 35

The system of example 34 may also include a digital display coupled with the processor to present a user interface view.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
a plurality of memory cells arranged to complete one or more operations responsive to a command from a memory device controller received via a command bus;
one or more first programmable counters maintained with the plurality of memory cells; and
an interface to the one or more first programmable counters to enable a first count value to be programmed to one or more of the first programmable counters, the first count value to set a first delay for the plurality of memory cells to transition from an idle power state to a first low power state after completion of the one or more operations, the first low power state to cause the plurality of memory cells to consume less power compared to the idle power state.

2. The apparatus of claim 1, the command comprises one of a read command or a write command.

3. The apparatus of claim 2, when the command is the write command, the one or more first programmable counters comprises a wait-after-write counter to count down or count up based on the first count value after a write operation is completed by the plurality of memory cells responsive to the write command.

4. The apparatus of claim 2, when the command is the read command, the one or more first programmable counters comprises a wait-after-read counter to count down or count up based on the first count value after a read operation is completed by the plurality of memory cells responsive to the read command.

5. The apparatus of claim 1, the interface to the one or more programmable counters comprises the interface to a plurality of registers maintained with the plurality of memory cells, the plurality of registers accessible to the memory device controller through the interface, the first count value programmed to one or more of the first programmable counters based on the memory device controller able to store the first count value to at least some of the plurality of registers.

6. The apparatus of claim 1, comprises a memory die arranged to be included with a plurality of other memory dies in a solid state drive, the memory die and the plurality of other memory dies to receive commands from the memory device controller via the command bus.

7. The apparatus of claim 1, comprises the one or more first programmable counters to be stopped responsive to a second command from the memory device controller received via the command bus before the first delay has expired, the plurality of memory cells to transition from the idle power state to an active power state after the one or more first programmable counters have been stopped, the active power state to cause the plurality of memory cells to consume more power compared to the idle power state.

8. The apparatus of claim 1, comprising:
one or more second programmable counters maintained with the plurality of memory cells; and
the interface to enable a second count value to be programmed to one or more of the second programmable counters, the second count value to set a second delay for the plurality of memory cells to transition from the first low power state to a second low power state after expiration of the of the one or more first programmable counters, the second low power state to cause the plurality of memory cells to consume less power compared to the first low power state.

9. The apparatus of claim 8, comprising the one or more second programmable counters to be stopped responsive to a second command from the memory device controller received via the command bus before the second delay has expired, the plurality of memory cells to transition from the second low power state to an active power state after the one or more second programmable counters have been stopped, the active power state to cause the plurality of memory cells to consume more power compared to the idle power state.

10. The apparatus of claim 1, the plurality of memory cells include one or more types of memory to include 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire, electrically erasable programmable read-only memory (EEPROM) or dynamic random access memory (DRAM).

11. A method comprising:
receiving, at a memory device, a command from a memory device controller for the memory device to complete one or more operations;
starting a first counter having a first count value following completion of the one or more operations, the first counter maintained at the memory device; and
causing the memory device to transition from an idle power state to a first low power state responsive to the first counter expiring, the first low power state to result in the memory device consuming less power compared to the idle power state.

12. The method of claim 11, comprising:
receiving a second command from the memory device controller before the first counter has expired;
stopping the first counter based on receiving the second command; and
causing the memory device to transition from the idle power state to an active power state, the active power state to result in the memory device consuming more power compared to the idle power state.

13. The method of claim 11, comprising:
programming the first counter to have the first count value responsive to receiving the first count value from the memory device controller.

14. The method of claim 11, the memory device comprising one of a plurality of memory dies included in a solid state drive, the plurality of memory dies capable of receiving commands from the memory device controller through at least one command bus.

15. The method of claim 11, comprising:
starting a second counter having a second count value following expiration of the first counter, the second counter maintained at the memory device; and
causing the memory device to transition from the first low power state to a second low power state responsive to the second counter expiring, the second low power state to result in the memory device consuming less power compared to the first low power state.

16. The method of claim 15, comprising:
receiving a second command from the memory device controller before the second counter has expired;
stopping the second counter based on receiving the second command; and
causing the memory device to transition from the first low power state to an active power state, the active power state to result in the memory device consuming more power compared to the idle power state.

17. The method of claim 15, comprising:
programming the second counter to have the second count value responsive to receiving the second count value from the memory device controller.

18. A system comprising:
a memory controller; and
a plurality of memory dies coupled with the memory controller via at least one command bus, the plurality of memory dies to separately include:
a plurality of memory cells arranged to complete one or more operations responsive to a command from the memory device controller;
one or more first programmable counters; and
an interface to the one or more first programmable counters to enable a first count value to be programmed to one or more of the first programmable counters, the first count value to set a first delay for the plurality of memory cells to transition from an idle power state to a first low power state after completion of the one or more operations, the first low power state to cause the plurality of memory cells to consume less power compared to the idle power state.

19. The system of claim 18, the command comprises one of a read command or a write command.

20. The system of claim 19, when the command is the write command, the one or more first programmable counters comprises a wait-after-write counter to count down or count up based on the first count value after a write operation is completed by the plurality of memory cells at a given memory die from among the plurality of memory dies responsive to the write command that is addressed to the given memory die.

21. The system of claim 19, when the command is the read command, the one or more first programmable counters comprises a wait-after-read counter to count down or count up based on the first count value after a read operation is completed by the plurality of memory cells at a given memory die from among the plurality of memory dies responsive to the read command that is addressed to the given memory die.

22. The system of claim 18, the interface to the one or more programmable counters comprises the interface to a plurality of registers separately maintained by respective memory dies of the plurality of memory dies, the plurality of registers accessible to the memory device controller through the interface, the first count value programmed to one or more of the first programmable counters based on the memory device controller able to store the first count value to the plurality of registers.

23. The system of claim 18, comprise the one or more first programmable counters to be stopped responsive to a second command from the memory device controller received via the command bus before the first delay has expired, a given memory die that received the first and second commands to transition the given memory die's plurality of memory cells from the idle power state to an active power state after the one or more first programmable counters have been stopped, the active power state to cause the given memory die's plurality of memory cells to consume more power compared to the idle power state.

24. The system of claim 18, comprises the plurality of memory dies to also separately include:
   one or more second programmable counters; and
   the interface to enable a second count value to be programmed to one or more of the second programmable counters, the second count value to set a second delay for the plurality of memory cells to transition from the first low power state to a second low power state after expiration of the one or more first programmable counters, the second low power state to cause the plurality of memory cells to consume less power compared to the first low power state.

25. The system of claim 24, comprising the one or more second programmable counters to be stopped responsive to a second command from the memory device controller received via the command bus before the second delay has expired, a given memory die that received the first and second commands to transition the given memory die's plurality of memory cells from the second low power state to an active power state after the one or more second programmable counters have been stopped, the active power state to cause the given memory die's plurality of memory cells to consume more power compared to the idle power state.

26. The system of claim 18, comprising:
   a processor for a computing platform, the processor coupled with the memory controller; and
   a network interface for the computing platform, the network interface coupled with the processor and the memory controller.

27. The system of claim 26, comprising a digital display coupled with the processor to present a user interface view.

* * * * *